(12) United States Patent
Lee et al.

(10) Patent No.: US 8,846,540 B2
(45) Date of Patent: Sep. 30, 2014

(54) SEMICONDUCTOR DEVICE WITH SILICON-CONTAINING HARD MASK AND METHOD FOR FABRICATING THE SAME

(71) Applicant: SK hynix Inc., Gyeonggi-do (KR)

(72) Inventors: Sung-Kwon Lee, Gyeonggi-do (KR); Jun-Hyeub Sun, Gyeonggi-do (KR); Young-Kyun Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/712,733

(22) Filed: Dec. 12, 2012

(65) Prior Publication Data
US 2014/0057442 A1 Feb. 27, 2014

(30) Foreign Application Priority Data

Aug. 24, 2012 (KR) .......................... 10-2012-0093045

(51) Int. Cl.
*H01L 21/302* (2006.01)
*H01L 21/461* (2006.01)

(52) U.S. Cl.
USPC ............ 438/719; 257/E21.197; 257/E21.218; 257/E21.232; 257/E21.252; 257/E21.312; 257/E21.577; 438/637; 438/694

(58) Field of Classification Search
USPC .................. 257/E21.197, E21.218, E21.232, 257/E21.252, E21.312, E21.577; 438/637, 438/694, 719
See application file for complete search history.

(56) References Cited

U.S. PATENT DOCUMENTS

| 2003/0207588 | A1  | 11/2003 | Goldbach |
| 2005/0224983 | A1* | 10/2005 | Kim et al. ...................... 257/758 |
| 2005/0260859 | A1* | 11/2005 | Deshpande et al. .......... 438/719 |
| 2008/0122107 | A1  | 5/2008  | Tsai et al. |
| 2011/0223769 | A1  | 9/2011  | Ko et al. |

FOREIGN PATENT DOCUMENTS

| KR | 1020060122578 | 11/2006 |
| KR | 1020070104154 | 10/2007 |
| KR | 1020080060363 | 7/2008 |
| KR | 1020100111433 | 10/2010 |

* cited by examiner

*Primary Examiner* — Asok K Sarkar
(74) *Attorney, Agent, or Firm* — IP & T Group LLP (57) ABSTRACT

A semiconductor device includes a semiconductor substrate having an etch target layer provided on the surface thereof, and a hard mask layer formed over the etch target layer and including silicon, wherein the hard mask layer includes a dual structure including a first area and a second area having a larger etch rate than the first area, in order to increase an etching selectivity of the hard mask layer.

16 Claims, 7 Drawing Sheets

SEMICONDUCTOR DEVICE WITH SILICON-CONTAINING HARD MASK AND METHOD FOR FABRICATING THE SAME

CROSS-REFERENCE TO RELATED APPLICATIONS

The present application claims priority of Korean Patent Application No. 10-2012-0093045, filed on Aug. 24, 2012, which is incorporated herein by reference in its entirety.

BACKGROUND

1. Field

Exemplary embodiments of the present invention relate to a method for fabricating a semiconductor device, and more particularly, to a semiconductor device with a silicon-containing hard mask and a method for fabricating the same.

2. Description of the Related Art

In general, patterns constituting a semiconductor device are formed by forming hard mask patterns over an etch target layer to be patterned and etching the etch target layer exposed between the hard mask patterns. When the hard mask patterns serving as an etch barrier are used to perform the etch process, the etch target layer under the hard mask patterns must not be exposed while the etch target layer exposed between the hard mask patterns is etched. However, as the patterns of the semiconductor device are highly integrated, the ratio of a thickness to be etched to a width to be etched (referred to as aspect ratio) of the etch target layer has increased. Accordingly, while the etch process is performed, the hard mask patterns may be removed. This is because, as the aspect ratio increases, the hard mask pattern having a smaller thickness than the etch target layer may be lost during the etch process. To solve such a problem, the hard mask pattern may be formed to a larger thickness. In this case, however, the aspect ratio of the hard mask pattern also increases. When the aspect ratio of the hard mask pattern increases, it is difficult to perform a stable etch process for forming the hard mask pattern as in the etch process for the etch target layer. For example, when a thick hard mask layer is etched, bowing may occur, and the etch process for the etch target layer under the hard mask layer may be influenced by the bowing occurring in the hard mask pattern.

SUMMARY

Exemplary embodiments of the present invention are directed to a semiconductor device and a method for fabricating the same, which is capable of preventing bowing even though the thickness of a hard mask layer increases and forming fine patterns with a high aspect ratio.

In accordance with an embodiment of the present invention, a semiconductor device includes a semiconductor substrate having an etch target layer provided on the surface thereof, and a hard mask layer formed over the etch target layer and including silicon, wherein the hard mask layer includes a dual structure including a first area and a second area having a larger etch rate than the first area, in order to increase an etching selectivity of the hard mask layer.

In accordance with another embodiment of the present invention, a method for fabricating a semiconductor device includes forming an etch target layer over a semiconductor substrate, forming a silicon-containing layer over the etch target layer, the silicon-containing layer comprising a first area and a second area formed over the first area and having a smaller etch rate than the first area, patterning the silicon-containing layer, and etching the etch target layer using the patterned silicon-containing layer as an etch barrier.

In accordance with yet another embodiment of the present invention, a method for fabricating a semiconductor device includes, forming an insulation layer over a semiconductor substrate, forming a polysilicon layer pattern over the insulation layer, the polysilicon layer pattern having an undoped area and a doped area formed over the undoped area, and forming a pattern by etching the insulation layer using the polysilicon layer pattern as an etch barrier.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 1A to 1F are diagrams illustrating a method for fabricating a semiconductor device in accordance with a first embodiment of the present invention.

Figure 1A:
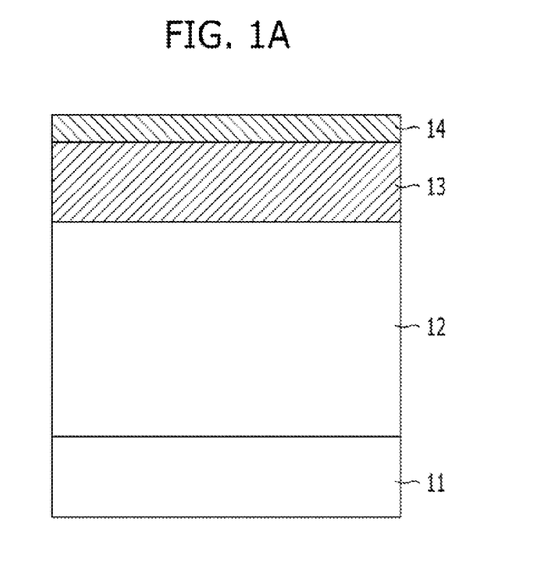
FIGS. 1A to 1F are diagrams illustrating a method for fabricating a semiconductor device in accordance with a first embodiment of the present invention.

Referring to FIG. 1A, an etch target layer 12 is formed over a semiconductor substrate 11. The etch target layer 12 is a material for forming patterns of a semiconductor device, and may include an insulation layer. For example, the etch target layer 12 may include an oxide layer and a nitride layer. The etch target layer 12 may include a plurality of oxide layers. Alternatively, the etch target layer 12 may include an oxide layer and a nitride layer which are sequentially stacked. Alternatively, the etch target layer 12 may include a plurality of oxide layers and nitride layers that are alternately stacked.

A hard mask layer is formed over the etch target layer 12. The hard mask layer may include a first area and a second area to increase an etching selectivity. The second area may be formed over the first area, and may have a smaller etch rate than the first area. Here, the etch rate indicates an etch rate during a dry etch process. Also, the second area may have a smaller thickness than the first area.

In order to form the first and second areas having different etch rates, an impurity may be doped. For example, the first area may include an undoped area, and the second area may include an impurity-doped area. As the impurity is doped, the first and second areas have different etch rates.

The undoped area and the doped area may be separately deposited.

Alternately, the undoped area and the doped area may be divided by an impurity concentration in a deposited layer. For example, an undoped area may be formed to a predetermined thickness, and a doping method such as ion implant may be used to form the doped area.

Hereafter, a case in which the hard mask layer includes separately deposited layers will be taken as an example for description. For example, the hard mask layer may be formed by stacking a first hard mask layer 13 and second hard mask layer 14. The first hard mask layer 13 corresponds to the undoped area, and the second hard mask layer 14 corresponds to the doped area. The second hard mask layer 14 may have a smaller etch rate than the first hard mask layer 13. The first and second hard mask layers 13 and 14 may include a silicon-containing material. The first and second hard mask layers 13 and 14 may include silicon such as amorphous silicon, polysilicon or the like.

The first hard mask layer 13 may include an undoped polysilicon layer. The second hard mask layer 14 may include an impurity-doped polysilicon layer. The first and second hard mask layers 13 and 14 may be formed by chemical vapor deposition (CVD). The total thickness of the first and second hard mask layers 13 and 14 may be set to about 8,000 Å, even though it may differ depending on the thickness of the etch target layer 12. For example, the first hard mask layer 13 may be formed to a thickness of about 2,000 to 6,000 Å, and the second hard mask layer 14 may be formed to a thickness of about 2,000 to 6,000 Å. It may be possible to form the first hard mask layer 13 to have a larger thickness than the second hard mask layer 14. Also, it may be possible to form the second hard mask layer 14 to have a larger thickness than the first hard mask layer 13. The first and second hard mask layer 13 and 14 may have the same thickness.

The impurity doped into the second hard mask layer 14 may include boron (B). Therefore, the second hard mask layer 14 may be a boron-containing polysilicon layer, that is, a boron-doped polysilicon layer. The undoped polysilicon layer and the boron-doped polysilicon layer may be formed by forming an amorphous silicon layer and then performing an annealing process. The boron-doped polysilicon layer may be formed by in-situ doping or ion implant using a boron-containing gas when a polysilicon layer is formed. The boron-containing gas may include B, $BF_2$ and the like. After the undoped-polysilicon layer is formed, the boron-doped polysilicon layer may be in-situ formed. The doping concentration of boron in the boron-doped polysilicon layer may set in the range of about $1\times10^{18}$ atoms/cm$^3$ or less. When the doping concentration of boron is larger than $1\times10^{18}$ atoms/cm$^3$, boron remains in a wide area such as a peripheral circuit area, and is difficult to remove during a subsequent process. The boron concentration of about $1\times10^{18}$ atoms/cm$^3$ or less is enough for the boron-doped polysilicon layer to be used as an etch barrier when the first hard mask layer 13 and the etch target layer 12 are etched. The doping concentration of boron may range from about $1\times10^{17}$ atoms/cm$^3$ to $1\times10^{18}$ atoms/cm$^3$. Depending on the concentration of boron, the etch rate of polysilicon doped with boron may change. For example, the etch rate of polysilicon doped with boron at the concentration of $1\times10^{18}$ atoms/cm$^3$ decreases by 80%, and the etch rate of polysilicon doped with boron at the concentration of $1\times10^{17}$ atoms/cm$^3$ decreases by 70%, with respect to the undoped polysilicon layer.

In another embodiment, the first and second hard mask layers 13 and 14 may be formed by ion implant. For example, an undoped polysilicon layer may be formed to a predetermined thickness, and boron may then be implanted into the upper part of the undoped polysilicon layer through ion implant. Accordingly, the boron-doped polysilicon layer may be formed over the undoped polysilicon layer.

As described above, the first and second hard mask layers 13 and 14 may contain silicon, and may include the undoped polysilicon layer and the boron-doped polysilicon layer, respectively.

The silicon layers show different etching characteristics depending on whether they contain an impurity or not and whether they are crystalline or not. During a dry etch process using plasma or the like, a polysilicon layer has a larger etch rate than an amorphous silicon layer. Furthermore, a phosphorus-doped polysilicon layer has the largest etch rate, and the etch rate gradually decreases in an order of the undoped polysilicon layer and the boron-doped polysilicon layer. Due to such an etch rate, when the phosphorus-doped polysilicon layer is etched, bowing may occur or a lateral etch rate may increase. Since the boron-doped polysilicon layer has a small etch rate, a tapered profile may be formed. Accordingly, when the boron-doped polysilicon layer and the undoped polysilicon layer are independently used, an etching profile may be poor. Furthermore, when the boron-doped polysilicon layer and the phosphorus-doped polysilicon layer have a large thickness, the etching profile becomes poorer. In the case of the undoped polysilicon layer, it may be easy to obtain a vertical profile, but an etch margin is insufficient during an etch process for the etch target layer 12. Therefore, in the first embodiment of the present invention, undoped polysilicon may be used to form the first hard mask layer 13, and boron-doped polysilicon may be used to form the second hard mask layer 14 over the first hard mask layer 13, in order to prevent bowing, excessive side-etching, and a tapered profile and obtain a vertical profile. Furthermore, when the first and second hard mask layers 13 and 14 may be maintained at such a sufficient thickness as to form fine patterns with a high aspect ratio when the etch target layer 12 is etched.

In the first embodiment of the present invention, the undoped polysilicon layer and the boron-doped polysilicon layer may be used to form the silicon-containing hard mask. Accordingly, when the etch target layer 12 is etched, the hard mask may be used as an etch barrier capable of forming fine patterns with a high aspect ratio. Furthermore, the etching profile of the silicon-containing hard mask patterns may be vertically formed. As the boron-doped polysilicon layer may be formed to a minimum thickness, a tapered profile may be suppressed. Furthermore, as the boron-doped polysilicon layer is used, it may be possible to compensate for a lack of etch margin, which may occur when the undoped polysilicon layer is independently used.

Meanwhile, a metal containing layer and amorphous carbon layer may be used as the hard mask layer. However, amorphous carbon layer has a poor morphology to make it difficult to pattern a subsequent photoresist layer. In the case of the metal containing layer including a metal or metal oxide, high-aspect-ratio etching may be easily performed even at a small thickness, but adhesion to the etch target layer 12 is low, and lifting may occur. Furthermore, after the etch process for the etch target layer 12 is completed, it may be difficult to remove the metal layer.

Figure 1B:
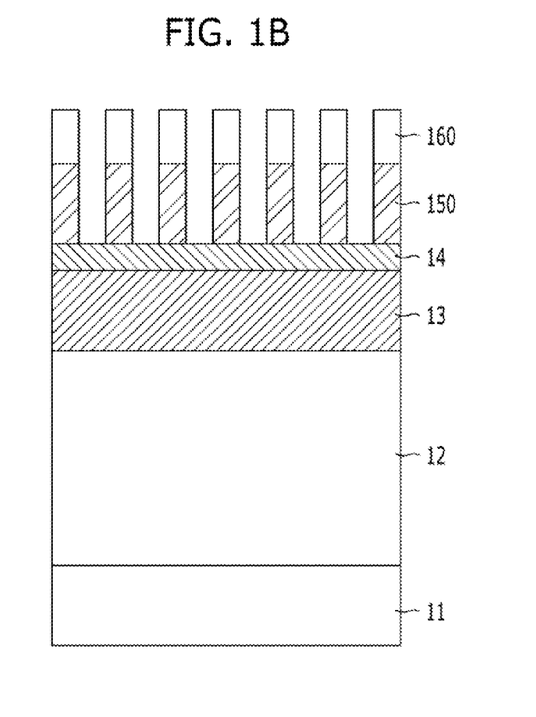

Referring to FIG. 1B, a photoresist pattern 160 is formed over the second hard mask layer 14. To etch the second hard mask layer 14 and then the first hard mask layer 13, a carbon-containing pattern 150 may be used as a third hard mask layer.

The carbon-containing pattern 150 may be formed by the photoresist pattern 160, and used as an etch barrier for etching the first and second hard mask layers 13 and 14. The carbon-containing pattern 150 may include amorphous carbon.

Figure 1C:
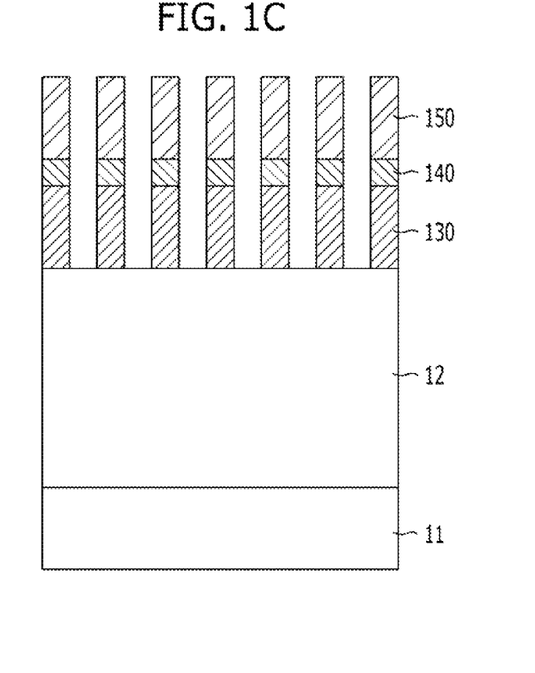

Referring to FIG. 1C, the photoresist pattern 160 is stripped. Then, the second and first hard mask layers 14 and 13 are etched using the carbon-containing pattern 150 as an etch barrier. Accordingly, a second hard mask layer pattern 140 and a first hard mask layer pattern 130 are formed.

When the first and second hard mask layers 13 and 14 are etched, a gas having a high selectivity with respect to the etch target layer 12 may be used as an etching gas. For example, when the etch target layer 12 includes oxide, a gas mixture of $CHF_2$, Ar, $O_2$ and $N_2$ or a gas mixture of HBr, $NF_3$, and $O_3$ may be used. The second hard mask layer pattern 140 using boron-doped polysilicon has a low etch rate, but has a small thickness, thus, a vertical profile may be obtained. Furthermore, although the first hard mask layer pattern 130 using undoped polysilicon has a large thickness, a vertical profile may be obtained by the above-described etch gases.

When the first and second hard mask layers 13 and 14 are etched in such a manner, it is possible to form the first and second hard mask layer patterns 130 and 140 having a vertical profile.

In another embodiment, the photoresist pattern 160 may not be stripped, but the photoresist pattern 160 and the carbon-containing pattern 150 may be used to etch the first and second hard mask layers 13 and 14. At this time, when the photoresist pattern 160 is completely consumed, the carbon-containing pattern 150 may serve as an etch barrier. Therefore, when the first and second hard mask layers 13 and 14 are etched, the carbon-containing pattern 150 and the photoresist pattern 160 may be used to sufficiently secure an etch margin. In addition to the carbon-containing pattern 150 and the photoresist pattern 160, an oxide layer may be used as the third hard mask layer. The oxide layer has a high etching selectivity during an etch process for polysilicon.

Figure 1D:
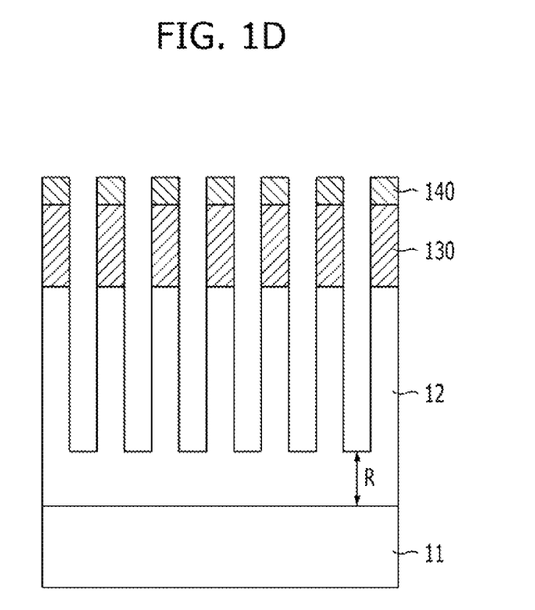
Figure 1E:
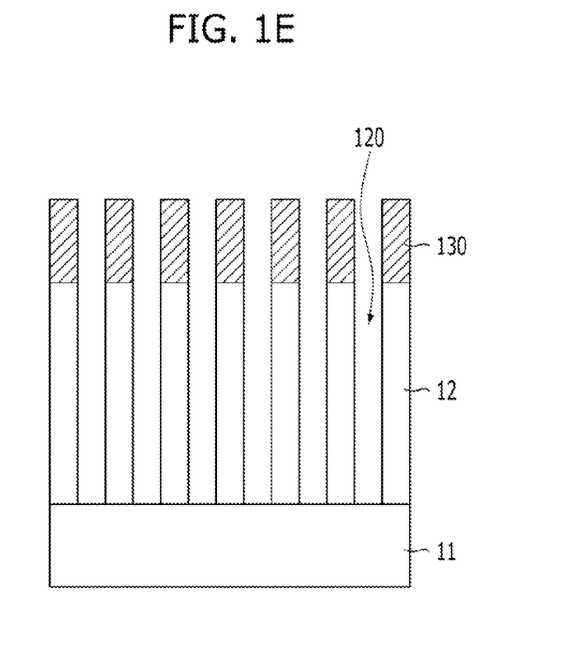

Referring to FIGS. 1D and 1E, the carbon-containing pattern 150 is removed. To remove the carbon-containing pattern 150, oxygen plasma may be used. When the photoresist pattern 160 is partially left after the first and second hard mask layers 13 and 14 are etched, the carbon-containing pattern 150 may be simultaneously removed while the photoresist pattern 160 is removed through a strip process.

Using the second and first hard mask layer patterns 140 and 130 as an etch barrier, the etch target layer 12 is etched. Accordingly, a plurality of patterns 120 are formed in the etch target layer 12. The patterns 120 may include a contact hole, a storage node hole, metal via hole and the like.

When the etch target layer 12 is etched, high-aspect-ratio etching may be performed, because the second hard mask layer pattern 140 and the first hard mask layer pattern 130 have a high etching selectivity. The etch target layer 12 may be etched by dry etching. For example, the etch target layer 12 may be etched by plasma etching. When the etch target layer 12 includes oxide, an etching gas having a high selectivity with respect to the first and second hard mask layers 13 and 14 may be used to etch the etch target layer 12.

After the etch process for the etch target layer 12 is completed, the second hard mask layer pattern 140 may not be left. That is, the second hard mask layer pattern 140 is left (refer to FIG. 1D) until the etch target layer 12 is etched to a predetermined depth, but may be completely consumed and removed at a time point when the etch target layer 12 is completely etched (refer to FIG. 1E). Since the second hard mask layer pattern 140 is doped with boron, the second hard mask layer pattern 140 must be removed. In the first embodiment of the present invention, the second hard mask layer pattern 140 may have a small thickness to be removed when the etch target layer 12 is completely etched.

The second hard mask layer pattern 140 may be simultaneously removed by etching the etch target layer 12 through plasma etching. The boron-doped polysilicon layer used as the second hard mask layer pattern 140 is easily removed by plasma etching. When the etch target layer 12 is formed of oxide, a fluorine-based gas such as $CHF_3$ or $CF_4$ may be used as an etching gas. Since the second hard mask layer 14 using boron-doped polysilicon has a small thickness, the second hard mask layer 14 may be easily removed while the etch target layer 12 is etched.

When the rest portion (refer to 'R' In FIG. 1D) of the etch target layer 12 is etched after the second hard mask layer pattern 140 is removed, the first hard mask layer pattern 130 serves as an etch barrier. Since the rest portion R of the etch target layer 12 has a small thickness, the rest portion R may be sufficiently etched by using the first hard mask layer pattern 130 as an etch barrier.

During wet etching for polysilicon, phosphorus-doped polysilicon and undoped polysilicon may be easily removed. However, boron-doped polysilicon is difficult to etch through wet etching. For example, phosphorus-doped polysilicon and undoped polysilicon are easily removed by $NH_4OH/H_2O_2$, $HNO_3/HF$, or TMAH-based chemical. However, boron-doped polysilicon may not be removed by $NH_4OH/H_2O_2$, $HNO_3/HF$, or TMAH-based chemical. In the first embodiment of the present invention, the second hard mask layer pattern 140 is removed while the etch target layer 12 is etched by plasma etching. Therefore, a separate process for removing the second hard mask layer pattern 140 is not required. Furthermore, although the second hard mask layer pattern 140 is removed, the rest portion R of the etch target layer may be removed without an attack.

Figure 1F:
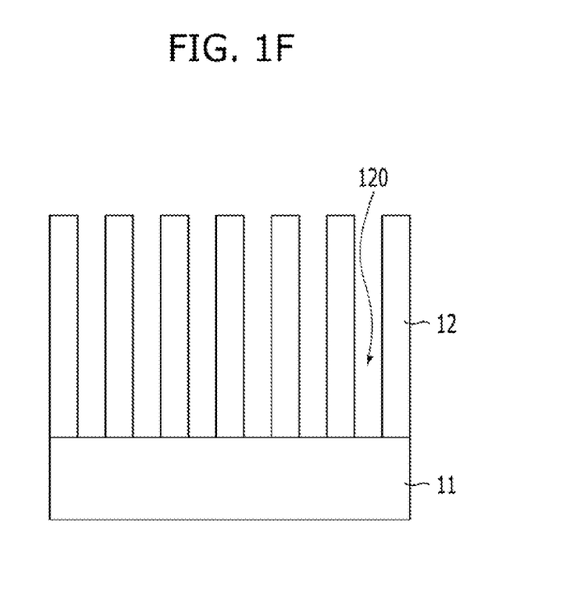

Referring to FIG. 1F, the first hard mask layer pattern 130 is removed. The first hard mask layer pattern 130 may be removed by plasma etching or wet etching. Since the first hard mask layer pattern 130 has a large thickness, wet etching is used to remove the first hard mask layer pattern 130 without affecting the patterns 120 and the etch target layer 12.

FIGS. 2A to 2H are diagrams illustrating a method for fabricating a semiconductor device in accordance with a second embodiment of the present invention.

Figure 2A:
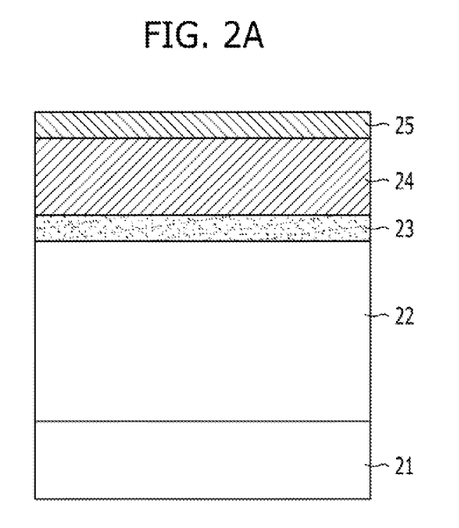
FIGS. 2A to 2H are diagrams illustrating a method for fabricating a semiconductor device in accordance with a second embodiment of the present invention.

Referring to FIG. 2A, a mold layer 22 is formed over a semiconductor substrate 21. The mold layer 22 is a material for providing an open space where a storage node of a capacitor is to be formed, and may include an insulation layer. For example, the mold layer 22 may include oxide. The mold layer 22 may include a plurality of oxide layers. The mold layer 22 may have a thickness of about 15,000 Å or more to secure capacitance. Before the mold layer 22 is formed, transistors, bit lines and the like may be formed in the semiconductor substrate. Furthermore, a plug such as a landing plug may be further formed over the semiconductor substrate 21.

A supporting layer 23 is formed over the mold layer 22. The supporting layer 23 serves to prevent a storage node from collapsing during a wet dip-out process. The supporting layer 23 may include nitride.

A hard mask layer is formed over the supporting layer 23. The hard mask layer may include first and second areas. The second area may be formed over the first area, and may have a smaller etch rate than the first area. The second area may have a smaller thickness than the first area. In order to form the first and second areas having different etch rates, an impurity may be doped. For example, the first area may include an undoped area, and the second area may include an impurity-doped area. As the impurity is doped, the first and second areas obtain different etch rates.

The undoped area and the doped area be separately deposited. Alternately, the undoped area and the doped area may be divided by an impurity concentration in a deposited layer. For example, after an undoped layer is formed to a predetermined thickness, a doping method such as ion implant may be used to form the doped area.

Hereafter, in the second embodiment of the present invention, a case in which the hard mask layer includes separately deposited layers will be taken as an example for description. For example, the hard mask layer may be formed by stacking first hard mask layer 24 and second hard mask layer 25. The total thickness of the first and second hard mask layers 24 and 25 may be set to about 8,000 Å, even though it may differ depending on the thickness of the mold layer 22. For example, the first hard mask layer 24 may be formed to a thickness of about 2,000 to 6,000 Å, and the second hard mask layer 25 may be formed to a thickness of about 2,000 to 6,000 Å. It may be possible to form the first hard mask layer 24 to have a larger thickness than the second hard mask layer 25. Also, it may be possible to form the second area 25 to have a larger thickness than the first hard mask layer 24. The first and second hard mask layer s 24 and 25 may have the same thickness. In the second embodiment of the present invention, the second hard mask layer 25 is formed to have a smaller thickness than the first hard mask layer 24.

The first and second hard mask layers 24 and 25 may include a silicon-containing material. The first and second hard mask layers 24 and 25 may include silicon such as amorphous silicon and polysilicon. The first and second hard mask layers 24 and 25 may include polysilicon. The first hard mask layer 24 may include an undoped polysilicon layer. The second hard mask layer 25 may include an impurity-doped polysilicon layer. The second hard mask layer 25 may be a boron-containing polysilicon layer, that is, a boron-doped polysilicon layer. The undoped polysilicon layer and the boron-doped polysilicon layer may be formed by forming amorphous polysilicon and performing an annealing process. The boron-doped polysilicon layer may be formed by in-situ doping or ion implant using a boron-containing gas when the polysilicon layer is formed. The boron-containing gas may include B, $BF_2$ and the like. The doping concentration of boron in the boron-doped polysilicon layer may set in the range of about $1\times10^{18}$ atoms/$cm^3$ or less. The concentration of about $1\times10^{18}$ atoms/$cm^3$ or less is enough for the boron-doped polysilicon layer to be used as an etch barrier. The doping concentration of boron may range from $1\times10^{17}$ atoms/$cm^3$ to $1\times10^{18}$ atoms/$cm^3$.

In the second embodiment of the present invention, undoped polysilicon is used to form the first hard mask layer 24, and boron-doped polysilicon is used to form the second hard mask layer 25 over the first hard mask layer 24, in order to prevent bowing, excessive side-etching, a tapered profile and obtain a vertical profile. Furthermore, the first and second hard mask layers 24 and 25 may be maintained at such a sufficient thickness as to form fine patterns with a high aspect ratio when the mold layer 22 is etched.

In the second embodiment of the present invention, undoped polysilicon and boron-doped polysilicon are used to form the silicon-containing hard mask layer. Accordingly, when the mold layer 22 is etched, the hard mask layer may be used as an etch barrier capable of forming fine patterns with a high aspect ratio. Furthermore, an etching profile of the silicon-containing hard mask layer pattern may be vertically formed. As the boron-doped polysilicon layer is formed to a small thickness, a tapered profile is suppressed. Furthermore, as the boron-doped polysilicon layer is used, it is possible to compensate for a lack of etch margin, which may occur when the undoped polysilicon layer is independently used.

Figure 2B:
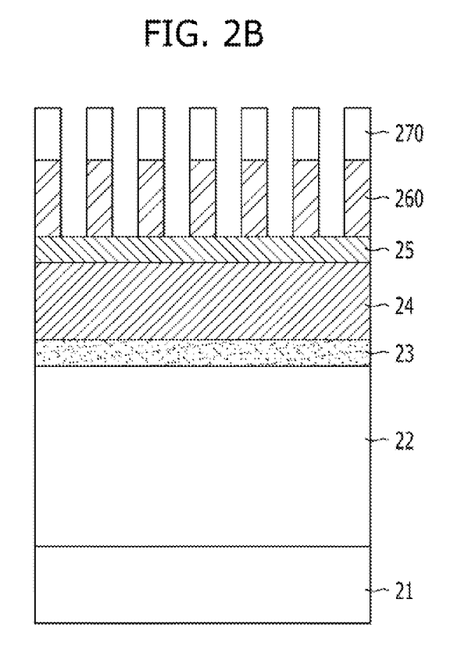

Referring to FIG. 2B, a photoresist pattern 270 is formed over the second hard mask layer 25. To etch the second hard mask layer 25 and then the first hard mask layer 24, a carbon-containing pattern 260 may be further used as a third hard mask layer. The carbon-containing pattern 260 may be formed by the photoresist pattern 270, and may be used as an etch barrier for etching the first and second hard mask layers 24 and 25.

Figure 2C:
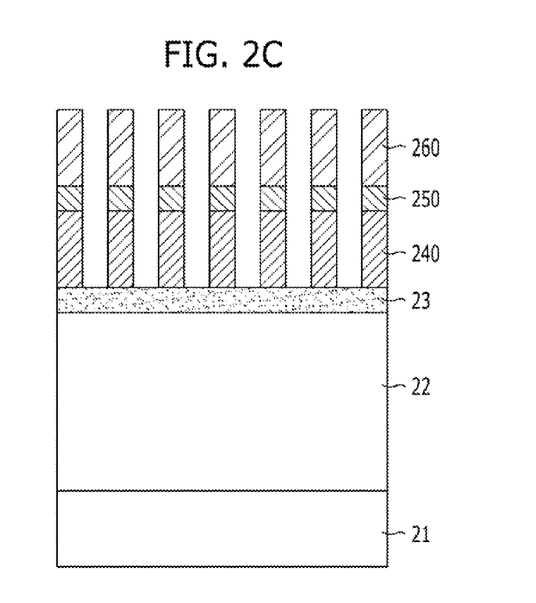

Referring to FIG. 2C, the photoresist pattern 270 is stripped. Then, the second and first hard mask layers 25 and 24 are etched by using the carbon-containing pattern 260 as an etch barrier. Accordingly, a second hard mask layer pattern 250 and a first hard mask layer pattern 240 are formed.

When the first and second hard mask layer 24 and 25 are etched, a gas mixture of $CHF_2$, $Ar$, $O_2$ and $N_2$ or a gas mixture of $HBr$, $NF_3$, and $O_3$ may be used as an etching gas. The second hard mask layer pattern 250 using boron-doped polysilicon has a relatively low etch rate, but has a small thickness, thus, a vertical profile may be obtained. Furthermore, although the first hard mask layer pattern 240 using undoped polysilicon has a large thickness, a vertical profile may be obtained by the above-described etching gases.

When the first and second hard mask layers 24 and 25 are etched in such a manner, the first and second hard mask layer patterns 240 and 250 are formed to have a vertical profile.

In another embodiment, the photoresist pattern 270 and the carbon-containing pattern 260 may be used to etch the first and second hard mask layers 24 and 25 without stripping the photoresist pattern 270. When the photoresist pattern 270 is completely consumed while the second hard mask layer 25 and then the first hard mask layer 24 are etched, the carbon-containing pattern 260 may serve as an etch barrier. Therefore, when the carbon-containing pattern 260 and the photoresist pattern 270 are used to etch the first and second hard mask layers 24 and 25, a sufficient etching margin may be secured. In addition to the carbon-containing pattern 260, an oxide layer may be used as the third hard mask layer. The oxide layer is a material having an etching selectivity during an etch process for polysilicon and nitride.

Figure 2D:
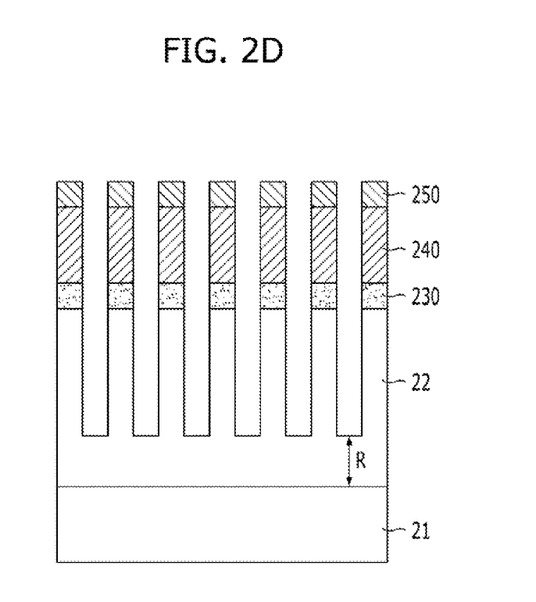
Figure 2E:
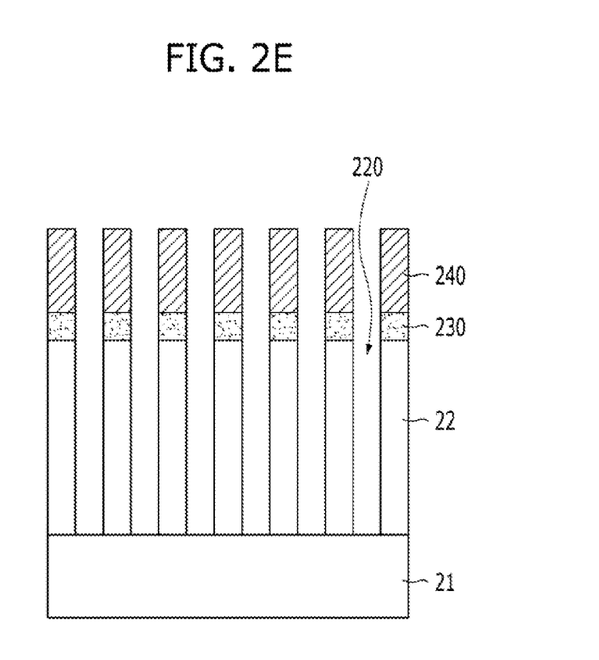

Referring to FIGS. 2D and 2E, the carbon-containing pattern 260 is removed. To remove the carbon-containing pattern 260, oxygen plasma may be used. When the photoresist pattern 270 is partially left after the first and second hard mask layers 24 and 25 are etched, the carbon-containing pattern 260 may be simultaneously removed while the photoresist pattern 270 is removed through a strip process.

Then, the supporting layer 23 and the mold layer 22 are etched by using the second and first areas 250 and 240 as an etch barrier. Accordingly, a plurality of patterns 220 are formed in the mold layer 22 (refer to FIG. 2E). The patterns 220 may include a hole where a storage node is to be formed. As the supporting layer 23 is etched, a supporter 230 may be formed.

When the supporting layer 23 and the mold layer 22 are etched, high-aspect-ratio etching may be performed, because the second and first hard mask layer patterns 250 and 240 have a high selectivity. The supporting layer 23 and the mold layer 22 may be etched through dry etching. For example, the supporting layer 23 and the mold layer 22 may be etched by plasma etching.

After the mold layer 22 is completely etched, the second hard mask layer pattern 250 may not be left. That is, the second hard mask layer pattern 250 may be left (refer to FIG. 2D) until the mold layer 22 is etched to a predetermined depth, but may be completely consumed and removed at a time point where the mold layer 22 is completely etched (refer to FIG. 2E). Since the second hard mask layer pattern 250 is doped with boron, the second hard mask layer pattern 250 must be removed. In the second embodiment of the present invention, the second hard mask layer pattern 250 may have a small thickness to be removed when the mold layer 22 is completely etched.

The second hard mask layer pattern 250 may be simultaneously removed by etching the mold layer 22 through plasma etching. The boron-doped polysilicon used as the second hard mask layer pattern 250 is easily removed by plasma etching. When the mold layer 22 is formed of oxide, a fluorine-based gas such as $CHF_3$ or $CF_4$ may be used as an etching gas. Since the second hard mask layer pattern 250 using boron-doped polysilicon has a small thickness, the second hard mask layer pattern 250 may be easily removed while the mold layer 22 is etched.

When the rest portion (refer to 'R' of FIG. 2D) of the mold layer 22 is etched after the second hard mask layer pattern 250 is removed, the first hard mask layer pattern 240 serves as an etch barrier. Since the rest portion R of the mold layer 22 has a small thickness, the rest portion R may be sufficiently etched by using the first hard mask layer pattern 240 as an etch barrier.

In accordance with the second embodiment of the present invention, the second hard mask layer pattern 250 is removed during plasma etching for the mold layer 22. Therefore, a separate process for removing the second hard mask layer pattern 250 is not required. Furthermore, although the second hard mask layer pattern 250 is removed, the rest portion R of the mold layer 22 may be etched without an attack.

Figure 2F:
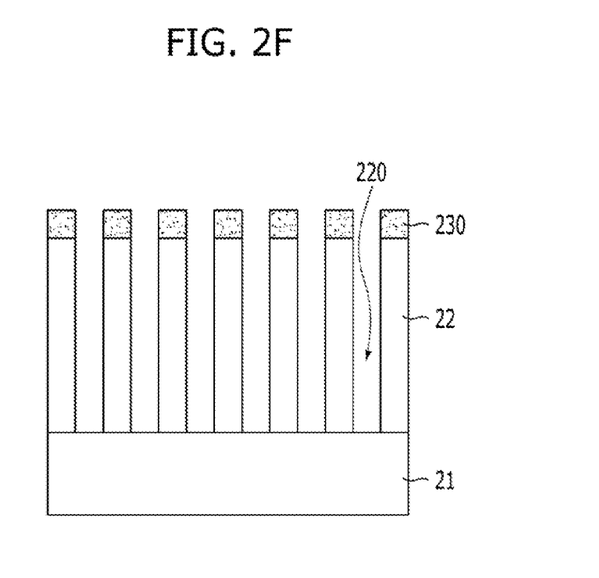

Referring to FIG. 2F, the first hard mask layer pattern 240 is removed. The first hard mask layer pattern 240 may be removed through plasma etching or wet etching. Since the first hard mask layer pattern 240 has a large thickness, wet etching is used to remove the first hard mask layer pattern 240 without affecting the patterns 220 and the mold layer 22.

Figure 2G:
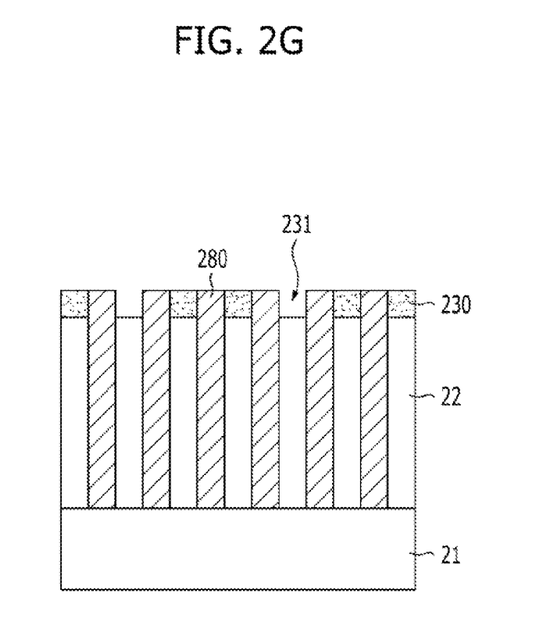

Referring to FIG. 2G, a conductive layer is formed on the entire surface of the resultant structure including the patterns 220, and a storage node isolation process is performed. Accordingly, a storage node 280 is formed in the pattern 220. The storage node 280 may be formed of titanium nitride (TiN). The storage node 280 may have a pillar shape. In another embodiment, the storage node 280 may have a cylinder shape.

Then, a part of the supporter 230 is etched to form an opening 231. The opening 231 serves as a path into which a wet chemical flows during a subsequent wet dip-out process.

Figure 2H:
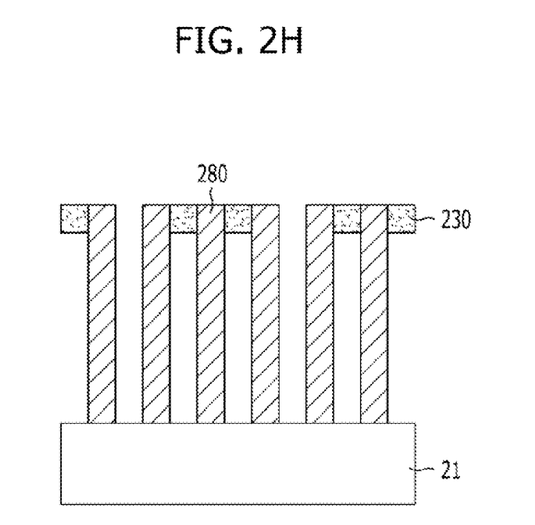

Referring to FIG. 2H, a wet dip-out process is performed to remove the mold layer 22. When the mold layer 22 is removed, the supporter 230 is not etched, but left to prevent the storage node 280 from collapsing. Since the storage node 280 is supported by the supporter 230 formed of nitride, this structure is referred to as a nitride floating capacitor (NFC) structure. In another embodiment, the supporter 230 may have a structure of two or more layers for example, a two-layer supporter may be formed by sequentially forming a first mold layer, a first supporting layer, a second mold layer, and a second supporting layer and removing the first and second mold layers. That is, a plurality of oxide layers and nitride layers may be alternately stacked, and the plurality of nitride layers may be used as a supporter. As such, when the supporter including two or more layers is applied, the storage node 280 may be further reliably formed.

Although not illustrated, a high-k material may be used to form a dielectric layer over the storage node 280, and a metal layer is used to form a plate over the dielectric layer.

In accordance with the embodiments of the present invention, the hard mask layer is formed by using the undoped polysilicon layer and the boron-doped polysilicon layer as an etch barrier. Therefore, fine patterns with a high aspect ratio may be easily formed. Accordingly, an etching profile of the hard mask pattern may be vertically formed, and the boron-doped polysilicon layer may be used to compensate for a lack of etch margin, which may occur when the undoped polysilicon layer is independently used.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an etch target layer over a semiconductor substrate;
   forming a silicon-containing layer over the etch target layer, the silicon-containing layer comprising a first area and a second area formed over the first area and having a smaller etch rate than the first area;
   patterning the silicon-containing layer; and
   etching the etch target layer using the patterned silicon-containing layer as an etch barrier,
   wherein a portion of the etch target layer is etched by using the first area and the second area as the etch barrier and a rest portion of the etch target layer is etched by using only the second area as the etch barrier.

2. The method of claim 1, wherein, in the forming of the silicon-containing layer,
   the second area comprises an impurity, and the first area is undoped.

3. The method of claim 2, wherein the impurity comprises boron.

4. The method of claim 1, wherein the forming of the silicon-containing layer comprises:
   forming an undoped silicon-containing layer as the first area; and
   forming a doped silicon-containing layer as the second area over the undoped silicon-containing layer, while in-situ doping an impurity.

5. The method of claim 1, wherein the forming of the silicon-containing layer comprises:
   forming an undoped silicon-containing layer as the first area; and
   forming the second area by doping an impurity into an upper portion of the undoped silicon-containing layer.

6. A method for fabricating a semiconductor device, comprising:
   forming an insulation layer over a semiconductor substrate;
   forming a polysilicon layer pattern over the insulation layer, the polysilicon layer pattern having an undoped area and a doped area formed over the undoped area; and
   forming a pattern by etching the insulation layer by using the polysilicon layer pattern as an etch barrier,
   wherein a portion of the insulation layer is etched by using the undoped area and the doped area as the etch barrier and a rest portion of the insulation layer is etched by using only the undoped area as the etch barrier.

7. The method of claim 6, wherein, in the forming of the polysilicon layer pattern, the doped area is formed by doping boron.

8. The method of claim 7, wherein the doping concentration of boron has a range of about $1 \times 10^{17}$ atoms/cm$^3$ to $1 \times 10^{18}$ atoms/cm$^3$.

9. The method of claim 6, wherein the forming of the polysilicon layer pattern comprises:
   forming an undoped polysilicon layer as the undoped area;
   forming a boron-doped polysilicon layer as the doped area over the undoped polysilicon layer, while in-situ doping boron;
   forming a carbon-containing pattern over the boron-doped polysilicon layer; and
   etching the boron-doped polysilicon layer and the undoped polysilicon layer using the carbon-containing pattern as an etch barrier.

10. The method of claim 9, wherein the carbon-containing pattern comprises amorphous carbon.

11. The method of claim 6, wherein the forming of the polysilicon layer pattern comprises:
   forming an undoped polysilicon layer as the undoped area;
   forming a boron-doped polysilicon layer as the doped area by doping boron into an upper portion of the undoped polysilicon layer;
   forming a carbon-containing pattern over the boron-doped polysilicon layer; and
   etching the boron-doped polysilicon layer and the undoped polysilicon layer using the carbon-containing pattern as an etch barrier.

12. The method of claim 6, wherein the doped area is formed to such a small thickness as to be removed at the same time when the insulation layer is completely etched.

13. The method of claim 6, wherein the doped area is formed to a smaller thickness than the undoped area.

14. The method of claim 6, further comprising removing the polysilicon layer pattern through wet etching, after the etching of the insulation layer.

15. The method of claim 6, wherein the insulation layer comprise an oxide layer, a nitride layer, a plurality of oxide layers, a stacked structure of oxide and nitride layers, or a structure in which a plurality of oxides and nitrides are alternately stacked.

16. The method of claim 6, further comprising, after the forming of the pattern:
   forming a storage node in the pattern; and
   removing the insulation layer.

\* \* \* \* \*